United States Patent
Ducellier et al.

[11] Patent Number: 6,118,117
[45] Date of Patent: Sep. 12, 2000

[54] OPTICAL PREAMPLIFIER DEVICE HAVING A WAVE LENGTH CONVERSION DEVICE

[75] Inventors: Thomas Ducellier, Ottawa, Canada; Jean-Paul Hebert, St Remy Les Chevreuse; Michel Goix, Ste Geneviéve des Bois, both of France

[73] Assignee: Alcatel, Paris, France

[21] Appl. No.: 09/146,243

[22] Filed: Sep. 3, 1998

[30] Foreign Application Priority Data

Sep. 4, 1997 [FR] France .................................. 97 11005

[51] Int. Cl.[7] ...................................... H01J 40/14
[52] U.S. Cl. ................. 250/214 LA; 250/214 R
[58] Field of Search ......................... 250/214 LA, 214 R, 250/214 A; 359/152, 339; 330/303

[56] References Cited

U.S. PATENT DOCUMENTS 4,807,227  2/1989  Fujiwara et al. ........................ 359/152

FOREIGN PATENT DOCUMENTS 0 639 876 A1  2/1995  European Pat. Off. .
0 762 580 A1  3/1997  European Pat. Off. .
2 737 585 A1  2/1997  France .

OTHER PUBLICATIONS

B. Mikkelsen et al, "High Performance Semiconductor and Optical Amplifiers as in–Line and Pre–Amplifiers", Proceedings of the European Conference on Optical Communication (EC, Firenze, Sep. 25–29, 1994, vol. 2, No. Conf. 20, Sep. 25, 1994, pp. 710–713.

G. Soulage et al, "Clamped Gain Travelling Wave Semiconductor Optical Amplifier as a Large Dynamic Range Optical Gate", Proceedings ot he European Conference on Optical Communication (EC, Firenze, Sep. 25–29, 1994, vol. 1, No. Conf. 20, Sep. 25, 1994, pp. 451–453.

*Primary Examiner*—Que T. Le
*Attorney, Agent, or Firm*—Sughrue, Mion, Zinn, Macpeak & Seas, PLLC

[57] ABSTRACT

An optical preamplifier device for a light receiver, the device including a first optical amplifier. The first optical amplifier is coupled to an input of an optical filter centered around a fixed wavelength $\lambda_o$ via a wavelength conversion device for converting wavelength to the fixed wavelength $\lambda_o$ of the filter, thereby enabling the device to be made independent of the wavelength $\lambda_i$ of the signal.

5 Claims, 1 Drawing Sheet

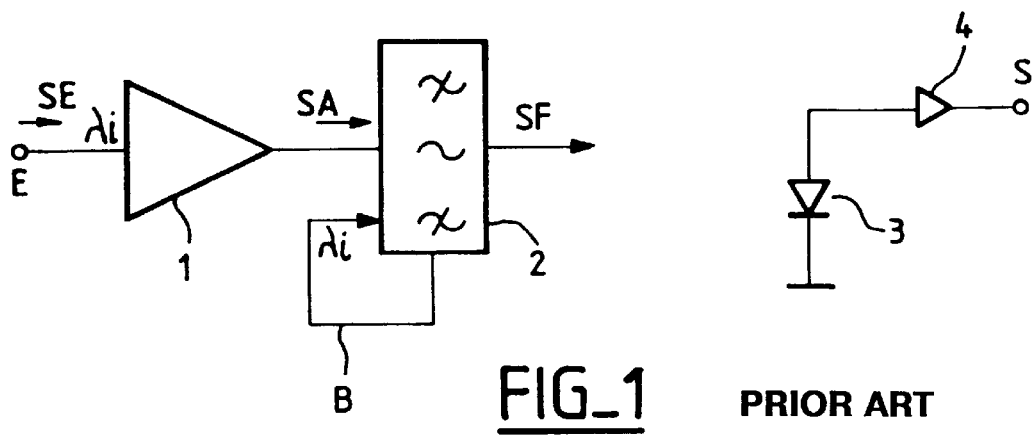
FIG_1 PRIOR ART
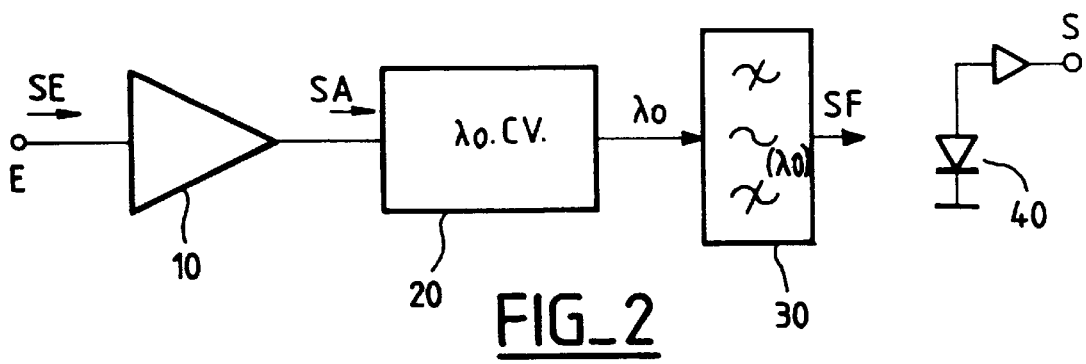
FIG_2
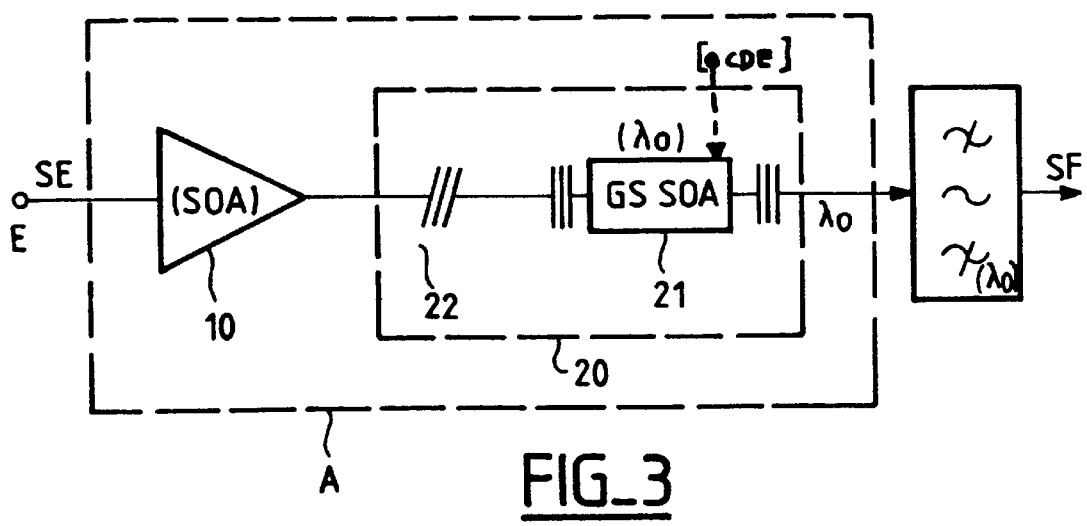
FIG_3

OPTICAL PREAMPLIFIER DEVICE HAVING A WAVE LENGTH CONVERSION DEVICE

The present invention relates to an optical preamplifier device. It is applicable to optical tele-communications and in particular to high data rate and high-sensitivity receivers.

BACKGROUND OF THE INVENTION

Optical preamplification is used in particular in high data rate receivers to amplify the signal in the optical domain rather than amplifying it in the electrical domain.

The main advantage of this is that the amplifier is a very low noise amplifier because optical amplification is based on movements of photons which givers rise to quantum noise, whereas electrical amplification is based on movements of electrons which gives rise to thermal noise, which is greater.

A diagram of a state-of-the-art optical preamplifier device for a receiver is shown in FIG. 1.

It is provided with an input E for the incident optical signal SE and with an output S delivering the amplified and detected signal. The input E is connected to a first optical amplifier 1 which is either a semiconductor optical amplifier (SOA) or an erbium-doped fiber amplifier (EDFA).

The amplifier is followed by a band-pass filter 2. The filter is tuned by means of a tuning loop B to the wavelength $\lambda_i$ of the incident signal SE.

The filter 2 is a tunable filter and it is tuned by the loop as a function of the wavelength $\lambda_i$ to pass the amplified signal SA without the broadband noise generated by the amplifier 1 (EDFA).

The amplified and filtered signal SF is detected by a photodetector such as a photodiode 3, and is optionally then electrically amplified 4 in the receiver.

The problem encountered by such an amplification device lies in the fact that the band-pass filter must be tuned to the wavelength $\lambda_i$ of the signal.

In practice, it is thus necessary to provide a tunable filter. The use of such filters raises numerous difficulties: they are complex to make, and they are costly; and also there are numerous problems that can give rise to poor tuning stability.

For such filters, complex filters are used that have negative feedback loops that enable the filters to remain locked on the wavelength of the incident signal, but such filters are costly and difficult to make in technical terms.

OBJECTS AND SUMMARY OF THE INVENTION

To solve that problem, it is proposed to provide an optical preamplifier device for a light receiver, the device including a first optical amplifier, wherein said first optical amplifier is coupled to a photodetector via a wavelength conversion device for converting wavelength to a fixed wavelength $\lambda_o$, and via an optical filter centered around said fixed wavelength $\lambda_o$.

According to another characteristic of the invention, the wavelength-conversion device comprises a gain-clamped semiconductor optical amplifier, the conversion wavelength $\lambda_o$ being the oscillation wavelength $\lambda_o$ generated by said gain-clamped amplifier, the input of the amplifier being connected to the output of the first optical amplifier via an optical stop filter for stopping said oscillation wavelength.

According to another characteristic of the invention, the stop filter is a sloping-grating filter.

According to another characteristic of the invention, the first optical amplifier is also a semiconductor optical amplifier.

The use of semiconductor optical amplifiers enables the preamplifier device to be made more compact because a semiconductor optical amplifier is more compact than an erbium-doped optical fiber (EDFA). This option also makes it possible to reduce the energy consumption of the device.

BRIEF DESCRIPTION OF THE DRAWING

Other characteristics and advantages of the invention appear on reading the following description given by way of non-limiting example and with reference to the accompanying drawing, in which:

FIG. 1 is a diagram showing a prior art device;

FIG. 2 is a general diagram showing the invention; and

FIG. 3 is a diagram showing a preferred embodiment.

MORE DETAILED DESCRIPTION

An optical preamplifier device of the invention comprises a first amplifier 10 whose input E receives an incident signal SE of arbitrary wavelength $\lambda_i$ lying in the transmission band used for optical telecommunications.

The output of the amplifier 10 is connected to the input of a wavelength converter device 20. This device is suitable for converting the wavelength of the amplified incident signal SA to a predefined auxiliary wavelength $\lambda_o$. The signal at the auxiliary wavelength $\lambda_o$ is applied to the input of a band-pass optical filter 30 centered around a fixed wavelength which is the wavelength $\lambda_o$.

The converted signal at the wavelength $\lambda_o$ is filtered by the fixed-wavelength optical filter 30 and is then detected by a photodiode 40.

By converting the wavelength of the incident signal, it is possible to make the optical preamplifier device independent of the wavelength of the incident signal, and therefore it is possible to use a fixed-wavelength optical filter.

A preferred embodiment of the invention is shown in FIG. 3. It makes it possible to integrate the various functions of the preamplifier device and therefore it is possible to make a component that is compact compared with prior art devices, i.e. a component occupying a few cubic centimeters (2 cm$^3$) instead of an electronic card occupying about a dozen square centimeters. This is particularly advantageous when a plurality of devices of this kind are used in applications for receiving wavelength division multiplexed (WDM) signals.

This embodiment consists in using a gain-clamped semiconductor optical amplifier (GC-SOA) as a wavelength converter, and in placing an isolator 22 at the input of the amplifier so as to stop the return oscillation generated by the amplifier 21.

As explained below, the isolator 22 may be formed by a stop filter which, in a preferred embodiment enabling integration to be achieved, is itself formed by a sloping grating.

It is recalled that a gain-clamped semiconductor optical amplifier is an amplifier in which feedback is created so that a laser cavity is established around the amplifying medium so that oscillation is generated inside the cavity at a pre-defined wavelength. The oscillation wavelength is pre-defined by construction during manufacture of the amplifier. A more detailed description of such an amplifier may be found, for example, in Patent Applications EP-A-0 639 876 and EP-A-0 762 580.

To stop return oscillation from propagating towards the amplifier 10, and thus to prevent the amplifier from saturating, provision is made for the isolator placed between the amplifier 10 and the gain-clamped amplifier to be formed by an optical stop filter that stops the oscillation wavelength $\lambda_o$.

Also for the purpose of making it possible to integrate the device, the stop filter is formed by a sloping grating. The technology required to make such a grating is well known and makes it possible, by construction, to attenuate a signal at the desired wavelength.

Thus, in this preferred embodiment, the preamplifier device for a receiver comprises two integrated semiconductor optical preamplifier stages, a fixed-wavelength optical filter, and a photodiode. One of the two amplification stages is formed by the low-noise semiconductor optical amplifier (SOA), and the other stage is formed by a gain-clamped semiconductor optical amplifier (GC-SOA) with return oscillation from this amplifier being stopped, thereby avoiding any saturation of the first optical amplifier.

The signal SE is highly amplified by the low-noise and high-gain amplifier (SOA) 10. Then its wavelength is converted to the oscillation wavelength $\lambda_o$ of the gain-clamped amplifier 21 (GC-SOA), which wavelength is chosen to be shorter than the wavelengths of the line transmission window (e.g. 1510 nm).

The converted signal is then filtered by a fixed-wavelength filter, and it is then detected by a photodiode.

This solution thus makes it possible to integrate the two amplification stages on an indium phosphide (InP) substrate (referenced A in FIG. 3).

This solution also offers the advantages of procuring an improved extinction ratio and of improving the optical signal-to-noise ratio (from 15 dB to a signal-to-noise ratio greater than 30 dB).

It is recalled that the signal-to-noise ratio and the extinction ratio are parameters enabling the quality of an optical signal to be defined.

Furthermore, the gain-clamped semiconductor optical amplifier of the device may be used as an electrically or optically controlled optical gate for performing time-division sampling or demultiplexing on the optical signals.

For this purpose, a gain control circuit CDE is connected to the amplifier to control the gain thereof. For example, the circuit may be a circuit for modulating the gain current of the amplifier.

What is claimed is:

1. An optical preamplifier device for a light receiver, the device including a first optical amplifier, wherein said first optical amplifier is coupled to a photodetector via a wavelength conversion device for converting wavelength to a fixed wavelength $\lambda_o$, and via an optical filter centered around said fixed wavelength $\lambda_o$.

2. A preamplifier device according to claim 1, wherein the optical wavelength-conversion device comprises a gain-clamped semiconductor optical amplifier, the conversion wavelength $\lambda_o$ being the oscillation wavelength $\lambda_o$ generated by said amplifier, the input of the amplifier being connected to the output of the first optical amplifier via an optical stop filter for stopping said oscillation wavelength.

3. A preamplifier device according to claim 2, wherein the stop filter is a sloping-grating filter.

4. A preamplifier device according to claim 1, wherein the first optical amplifier is also a semiconductor optical amplifier.

5. A preamplifier device according to claim 1, wherein the semiconductor optical amplifier of the conversion device is electrically or optically controlled so as to form an optical gate.

* * * * *